United States Patent
Wang et al.

(10) Patent No.: US 8,593,586 B2
(45) Date of Patent: Nov. 26, 2013

(54) LIQUID CRYSTAL DISPLAY HAVING QUANTUM DOT REMOTE PHOSPHOR

(75) Inventors: Ying-Li Wang, Taichung (TW); Chien Shen, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 122 days.

(21) Appl. No.: 13/407,691

(22) Filed: Feb. 28, 2012

(65) Prior Publication Data

US 2013/0021560 A1  Jan. 24, 2013

(30) Foreign Application Priority Data

Jul. 21, 2011  (TW) .............................. 100125807 A

(51) Int. Cl.
*G02F 1/01*    (2006.01)
*G02F 1/017*   (2006.01)

(52) U.S. Cl.
USPC ............ 349/61; 362/97.2; 362/231; 313/483; 313/498; 313/504; 349/108; 349/69; 349/70; 349/71; 349/106

(58) Field of Classification Search
None
See application file for complete search history.

(56) References Cited

U.S. PATENT DOCUMENTS

| | | | | |
|---|---|---|---|---|
| 7,850,336 B2 * | 12/2010 | Kim et al. | ...... | 362/231 |
| 7,893,612 B2 * | 2/2011 | Cok | ...... | 313/506 |
| 2010/0208172 A1 | 8/2010 | Jang et al. | | |
| 2011/0156575 A1 | 6/2011 | Yu et al. | | |

* cited by examiner

*Primary Examiner* — Bumsuk Won
*Assistant Examiner* — Angela Davison
(74) *Attorney, Agent, or Firm* — Jianq Chyun IP Office

(57) ABSTRACT

A liquid crystal display including a backlight unit and a liquid crystal display panel is provided. The backlight unit includes an exciting light source and quantum dot remote phosphor. Spectrum of the backlight unit has relative maximum brightness peaks BL1, BL2 and BL3 between 445 nm to 455 nm, between 528 nm to 538 nm, and between 618 nm to 628 nm, respectively. The liquid crystal display panel is disposed above the backlight unit and has a red color filter, a green color filter, a blue color filter and a yellow color filter, wherein areas of the red color filter, the green color filter, the blue color filter and the yellow color filter are $A_R$、$A_G$、$A_B$、$A_Y$, respectively. The areas $A_R$、$A_G$、$A_B$、$A_Y$ satisfy the following relationship: $0.75 < A_R/A_G < 0.85$; $0.3 < A_R/A_B < 0.4$; and $0.95 < A_R/A_Y < 1.05$.

9 Claims, 4 Drawing Sheets

LIQUID CRYSTAL DISPLAY HAVING QUANTUM DOT REMOTE PHOSPHOR

CROSS-REFERENCE TO RELATED APPLICATION

This application claims the priority benefit of Taiwan application serial no. 100125807, filed on Jul. 21, 2011. The entirety of the above-mentioned patent application is hereby incorporated by reference herein and made a part of this specification.

BACKGROUND OF THE INVENTION

1. Field of the Invention

The application relates to a liquid crystal display (LCD). More particularly, the application relates to an LCD that is characterized by favorable color saturation.

2. Description of Related Art

The LCD featuring advantages that include small and compact size, high definition, low power consumption, and no radiation has gradually replaced the conventional cathode ray tube (CRT) display and become the mainstream product in the market of the displays. However, in comparison with the CRT display, the LCD often requires a backlight unit for displaying images. The common backlight units in the LCDs include cold-cathode fluorescent lamp (CCFL) backlight units and light emitting diode (LED) backlight units.

Since a white LED is characterized by low heat generation, low power consumption, long service life, fast response speed, compactness, and is suitable for planar package, the evolution of the white LED is regarded as a "white illumination revolution". Besides, the white LED has been gradually applied in backlight modules of portable displays and televisions due to its advantages of low power consumption, small size, and fast response speed.

In the commonly used white LED, a blue LED chip is often employed together with yttrium aluminum garnet (YAG), and the blue LED is easy to be packaged and has compact size. Recently, quantum dot remote phosphor has been increasingly applied to the LED. The quantum dot remote phosphor is a quasi-zero-dimensional nano material that is constituted by several or dozens of atoms. In the quantum dot remote phosphor, the movement of electrons within the three-dimensional space is confined, and thus the photoelectric properties of the quantum dot remote phosphor are rather different from the photoelectric properties of the bulk-type phosphor. For instance, quantum dot remote phosphor which has different size but is irradiated by the same exciting light source emits secondary light with different wavelengths. If the quantum dot remote phosphor with different size is mixed, and the well-mixed quantum dot remote phosphor is irradiated by the same exciting light, the secondary light with different wavelengths can be simultaneously generated.

Compared to the conventional organic phosphor, the quantum dot remote phosphor has favorable light emission efficiency. Hence, when the quantum dot remote phosphor is applied to the backlight unit of the LCD, it is expected that color saturation (NTSC %) of the LCD can be improved. Although the quantum dot remote phosphor can enhance color saturation of the LCD, the chromatic coordinate of the white dot often shifts. As a result, it is rather imperative to resolve the issue of the shifted chromatic coordinate of the white dot caused by the quantum dot remote phosphor.

SUMMARY OF THE INVENTION

The application is directed to an LCD that has favorable color saturation and satisfactory white color display performance.

In this application, an LCD that includes a backlight unit and an LCD panel is provided. The backlight unit includes an exciting light source and quantum dot remote phosphor. A spectrum of the backlight unit has relative maximum brightness peaks BL1, BL2, and BL3 when wavelengths of light range from 445 nm to 455 nm, from 528 nm to 538 nm, and from 618 nm to 628 nm, respectively, and the relative maximum brightness peak BL1 is higher than the relative maximum brightness peak BL2. The LCD panel is located above the backlight unit and has a red filter layer, a green filter layer, a blue filter layer, and a yellow filter layer. Areas of the red, green, blue, and yellow filter layers are $A_R$, $A_G$, $A_B$, and $A_Y$, respectively, and the areas $A_R$, $A_G$, $A_B$, and $A_Y$ satisfy following conditions:

$0.75 < A_R/A_G < 0.85;$ $0.3 < A_R/A_B < 0.4;$ and $0.95 < A_R/A_Y < 1.05.$

According to an embodiment in the application, the red, green, blue, and yellow filter layers satisfy following conditions:

When the backlight unit irradiates the red filter layer, $R_x$ is defined as an x coordinate of a red light filtered by the red filter layer in a CIE 1931 chromaticity coordinate diagram, $R_y$ is defined as an y coordinate of the red light filtered by the red filter layer in the CIE 1931 chromaticity coordinate diagram, $0.665 < R_x < 0.675$, and $0.305 < R_y < 0.315$.

When the backlight unit irradiates the green filter layer, $G_x$ is defined as an x coordinate of a green light filtered by the green filter layer in the CIE 1931 chromaticity coordinate diagram, $G_y$ is defined as an y coordinate of the green light filtered by the green filter layer in the CIE 1931 chromaticity coordinate diagram, $0.235 < G_x < 0.245$, and $0.690 < G_y < 0.700$.

When the backlight unit irradiates the blue filter layer, $B_x$ is defined as an x coordinate of a blue light filtered by the blue filter layer in the CIE 1931 chromaticity coordinate diagram, $B_y$ is defined as an y coordinate of the blue light filtered by the blue filter layer in the CIE 1931 chromaticity coordinate diagram, $0.150 < B_x < 0.160$, and $0.060 < B_y < 0.070$.

When the backlight unit irradiates the yellow filter layer, $Y_x$ is defined as an x coordinate of a yellow light filtered by the yellow filter layer in the CIE 1931 chromaticity coordinate diagram, $Y_y$ is defined as an y coordinate of the yellow light filtered by the yellow filter layer in the CIE 1931 chromaticity coordinate diagram, $0.430 < Y_x < 0.440$, and $0.530 < Y_y < 0.540$.

According to an embodiment in the application, the relative maximum brightness peak BL1 is higher than the relative maximum brightness peak BL3.

According to an embodiment in the application, BL1:BL2:BL3=1:0.63:0.657.

According to an embodiment in the application, when the backlight unit irradiates the LCD panel, a chromatic coordinate of a white dot on the LCD panel is ($W_x$, $W_y$), $0.275 < W_x < 0.285$, and $0.285 < W_y < 0.295$.

According to an embodiment in the application, $A_R:A_G:A_B:A_Y=1:1.3:3:1$.

According to an embodiment in the application, the backlight unit includes a direct-type backlight unit or an edge-type backlight unit.

According to an embodiment in the application, the exciting light source includes an LED chip package. The LED chip package includes a carrier, an LED chip, and a molding compound. The LED chip emits exciting light. Besides, the LED chip is configured on the carrier and electrically connected to the carrier. The molding compound encapsulates a portion of the carrier and the LED chip. The quantum dot remote phosphor is distributed in the molding compound and located on a transmission path of the exciting light.

According to an embodiment in the application, the exciting light source includes an LED chip package. The LED chip package includes a carrier, an LED chip, and a molding compound. The LED chip emits exciting light, and the LED chip is configured on the carrier and electrically connected to the carrier. The quantum dot remote phosphor covers the LED chip and is located on a transmission path of the exciting light. The molding compound encapsulates a portion of the carrier and the LED chip.

In this application, the ratio of areas occupied by the red, green, blue, and yellow filter layers is controlled to resolve the issue of the shifted chromatic coordinate of the white dot caused by the quantum dot remote phosphor. Accordingly, the LCD of this application is characterized by favorable color saturation and satisfactory white color display performance.

To make the above and other features and advantages of the application more comprehensible, several embodiments accompanied with figures are detailed as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
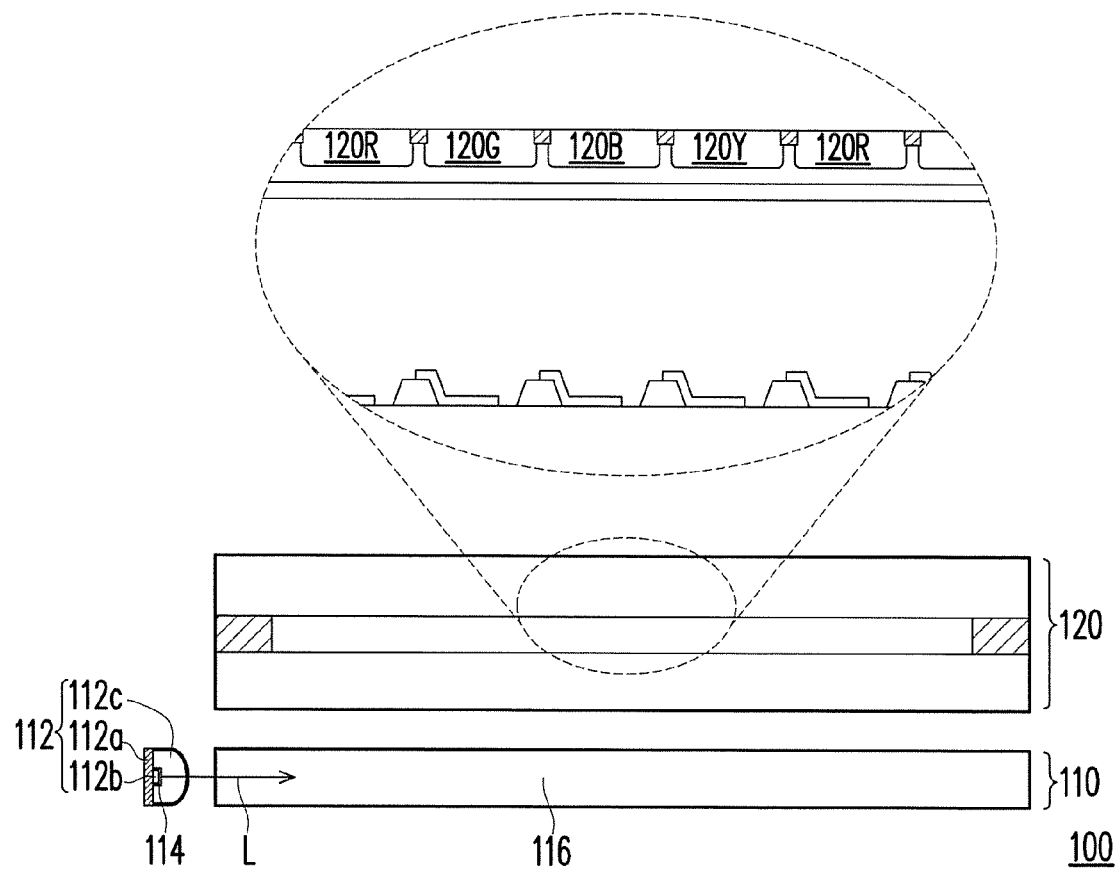
FIG. 1 is a schematic view illustrating an LCD according to an embodiment of the invention.
Figure 2:
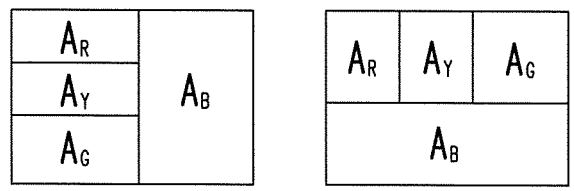
FIG. 2 illustrates a spectrum of the backlight unit depicted in FIG. 1.
Figure 2:
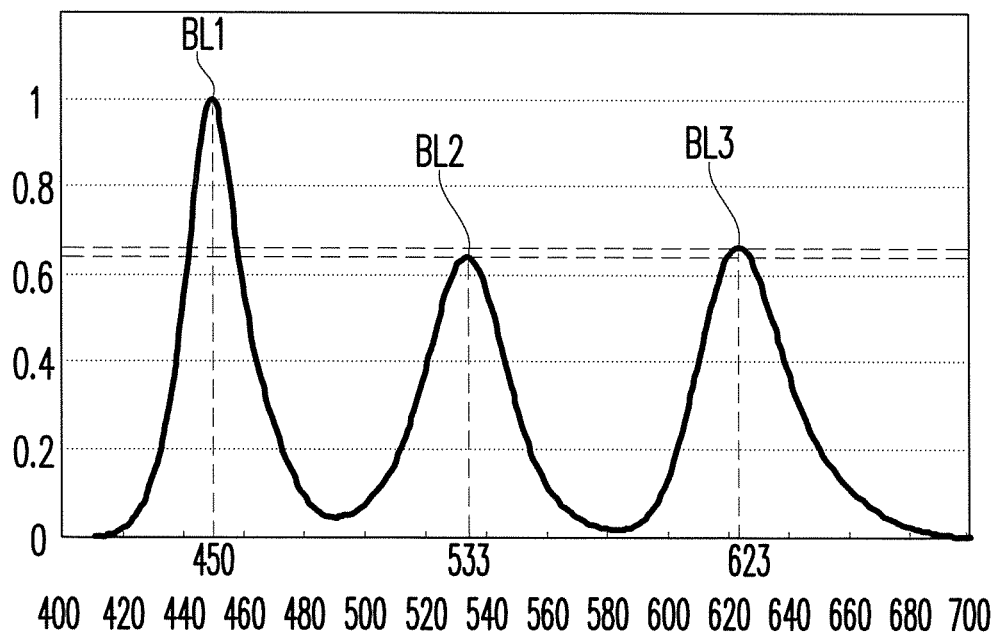

FIG. 1 is a schematic view illustrating an LCD according to an embodiment of the invention. FIG. 2 illustrates a spectrum of the backlight unit depicted in FIG. 1. With reference to FIG. 1 and FIG. 2, the LCD 100 of this embodiment includes a backlight unit 110 and an LCD panel 120. The backlight unit 110 includes an exciting light source 112 and quantum dot remote phosphor 114. A spectrum of the backlight unit 110 has relative maximum brightness peaks BL1, BL2, and BL3 when wavelengths of light range from 445 nm to 455 nm, from 528 nm to 538 nm, and from 618 nm to 628 nm, respectively, and the relative maximum brightness peak BL1 is higher than the relative maximum brightness peak BL2. The LCD panel 120 is configured above the backlight unit 110 and has a red filter layer 120R, a green filter layer 120G, a blue filter layer 120B, and a yellow filter layer 120Y. Areas of the red, green, blue, and yellow filter layers 120R, 120G, 120B, and 120Y are $A_R$, $A_G$, $A_B$, and $A_Y$, respectively, and the areas $A_R$, $A_G$, $A_B$, and $A_Y$ satisfy the following inequalities (1)~(3):

$$0.75 < A_R/A_G < 0.85 \quad (1)$$

$$0.3 < A_R/A_B < 0.4 \quad (2)$$

$$0.95 < A_R/A_Y < 1.05 \quad (3)$$

In this application, the ratio of areas occupied by the red filter layer 120R, the green filter layer 120G, the blue filter layer 120B, and the yellow filter layer 120Y can be considered as the ratio of areas occupied by red, green, blue, and yellow sub-pixels. According to an embodiment, the ratio of the areas occupied by the red filter layer 120R, the green filter layer 120G, the blue filter layer 120B, and the yellow filter layer 120Y can be $A_R:A_G:A_B:A_Y$, and $A_R:A_G:A_B:A_Y=1:1.3:3:1$. That is to say, in a single display pixel, the ratio of the areas occupied by the red, green, blue, and yellow sub-pixels is $A_R:A_G:A_B:A_Y$ as well, and $A_R:A_G:A_B:A_Y=1:1.3:3:1$, as indicated in FIG. 2.

In this embodiment, the chromatic coordinates of the red light filtered by the red filter layer 120R, the green light filtered by the green filter layer 120G, the blue light filtered by the blue filter layer 120B, and the yellow light filtered by the yellow filter layer 120Y should satisfy the following exemplary conditions. When the backlight unit 110 irradiates the red filter layer 120R, $R_x$ is defined as an x coordinate of the red light filtered by the red filter layer 120R in a CIE 1931 chromaticity coordinate diagram, $R_y$ is defined as an y coordinate of the red light filtered by the red filter layer 120R in the CIE 1931 chromaticity coordinate diagram, $0.665 < R_x < 0.675$, and $0.305 < R_y < 0.315$. When the backlight unit 110 irradiates the green filter layer 120G, $G_x$ is defined as an x coordinate of the green light filtered by the green filter layer 120G in the CIE 1931 chromaticity coordinate diagram, $G_y$ is defined as an y coordinate of the green light filtered by the green filter layer 120G in the CIE 1931 chromaticity coordinate diagram, $0.235 < G_x < 0.245$, and $0.690 < G_y < 0.700$. When the backlight unit 110 irradiates the blue filter layer 120B, $B_x$ is defined as an x coordinate of the blue light filtered by the blue filter layer 120B in the CIE 1931 chromaticity coordinate diagram, $B_y$ is defined as an y coordinate of the blue light filtered by the blue filter layer 120B in the CIE 1931 chromaticity coordinate diagram, $0.150 < B_x < 0.160$, and $0.060 < B_y < 0.070$. When the backlight unit 110 irradiates the yellow filter layer 120Y, $Y_x$ is defined as an x coordinate of the yellow light filtered by the yellow filter layer 120Y in the CIE 1931 chromaticity coordinate diagram, $Y_y$ is defined as an y coordinate of the yellow light filtered by the yellow filter layer 120Y in the CIE 1931 chromaticity coordinate diagram, $0.430 < Y_x < 0.440$, and $0.530 < Y_y < 0.540$.

According to an embodiment in the application, $R_x$ is approximately 0.667, $R_y$ is approximately 0.310, $G_x$ is approximately 0.239, $G_y$ is approximately 0.692, $B_x$ is approximately 0.155, $B_y$ is approximately 0.063, $Y_x$ is approximately 0.434, and $Y_y$ is approximately 0.535.

In this embodiment, the relative maximum brightness peak BL1 is higher than the relative maximum brightness peak BL2, and the relative maximum brightness peak BL1 is also higher than the relative maximum brightness peak BL3. According to an embodiment in the application, the ratio of the relative maximum brightness peaks BL1, BL2, and BL3 is represented by the following equation: BL1:BL2:BL3=1:0.63:0.657.

When the backlight unit 110 of this embodiment irradiates the LCD panel 120, a chromatic coordinate of a white dot on the LCD panel 120 is ($W_x$, $W_y$), $0.275 < W_x < 0.285$, and $0.285 < W_y < 0.295$. In an embodiment of the application, $W_x$ is approximately 0.283, and $W_y$ is approximately 0.291. The color saturation (NTSC %) of the LCD panel 120 is approximately 95.3%.

As indicated in FIG. 1, the backlight unit 110 of this embodiment is an edge-type backlight unit, for instance, and the backlight unit 110 not only includes the exciting light source 112 and the quantum dot remote phosphor 114 but also includes a light guide plate (LGP) 116. Note that the backlight unit 110 of this embodiment can also be a direct-type backlight unit and also includes the exciting light source 112 and the quantum dot remote phosphor 114. However, the exciting light source 112 and the quantum dot remote phosphor 114 of the direct-type backlight unit 110 are directly configured below the LCD panel 120 to provide the required light for displaying images.

Figure 3A:
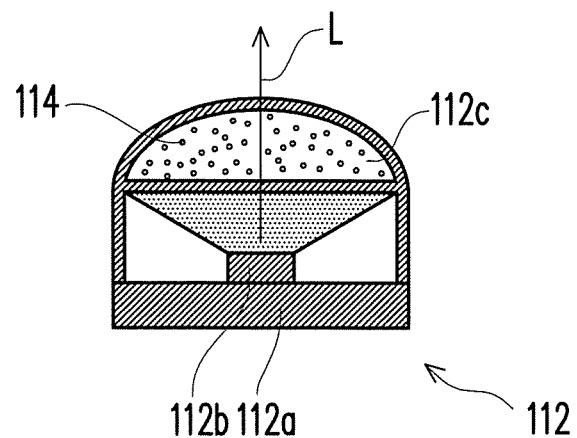
FIG. 3A and FIG. 3B illustrate the combination of quantum dot remote phosphor and two different exciting light sources.
Figure 3B:
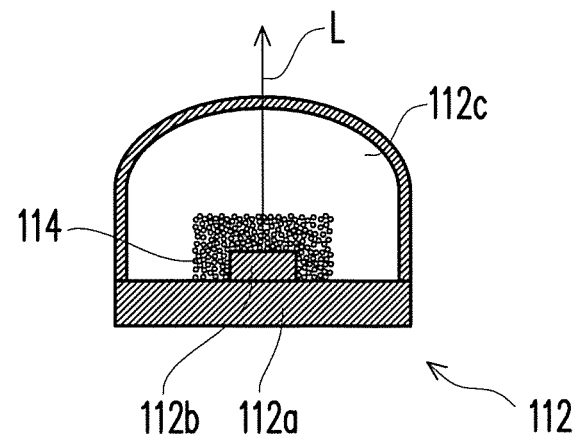

FIG. 3A and FIG. 3B illustrate the combination of quantum dot remote phosphor and two different exciting light sources. With reference to FIG. 3A, the exciting light source 112 of this embodiment is an LED chip package, for instance, and the LED chip package includes a carrier 112a, an LED chip 112b, and a molding compound 112c. The LED chip 112b is suitable for emitting exciting light L. Besides, the LED chip 112b is configured on the carrier 112a and electrically connected to the carrier 112a. The molding compound 112c encapsulates a portion of the carrier 112a and the LED chip 112b. The quantum dot remote phosphor 114 is randomly and evenly distributed in the molding compound 112c and located on a transmission path of the exciting light L.

With reference to FIG. 3B, the exciting light source 112 in another embodiment in the application is an LED chip package as well, and the LED chip package includes a carrier 112a, an LED chip 112b, and a molding compound 112c. The LED chip 112b is suitable for emitting exciting light L, and the LED chip 112b is configured on the carrier 112a and electrically connected to the carrier 112a. The quantum dot remote phosphor 114 covers the LED chip 112b and is located on a transmission path of the exciting light L. The molding compound 112c encapsulates a portion of the carrier 112a and the LED chip 112b.

In this application, the ratio of areas occupied by the red, green, blue, and yellow filter layers is controlled to resolve the issue of the shifted chromatic coordinate of the white dot caused by the quantum dot remote phosphor. Accordingly, the LCD of this application is characterized by favorable color saturation and satisfactory white color display performance.

Experimental Example

When the spectrum of the backlight unit is as shown in FIG. 2 (i.e., BL1:BL2:BL3=1:0.63:0.657), the values of $R_x$, $R_y$, RY, $G_x$, $G_y$, GY, $B_x$, $B_y$, BY, $Y_x$, $Y_y$, and YY comply with the values shown in the left columns of Table 1. Besides, when $A_R:A_G:A_B:A_Y=1:1.3:3:1$, the chromatic coordinate of the white dot on the LCD panel is (0.283, 0.291), and the color saturation (NTSC %) of the LCD panel is approximately 95.3%. RY, GY, BY, and YY respectively denote the luminance of the red, green, blue, and yellow filter layers irradiated by the above-mentioned backlight unit.

TABLE 1

| $R_x$ | $R_y$ | RY | $G_x$ | $G_y$ | GY | $B_x$ | $B_y$ | BY | $Y_x$ | $Y_y$ | YY | Wx | Wy | WY | NTSC % |
|---|---|---|---|---|---|---|---|---|---|---|---|---|---|---|---|
| 0.667 | 0.310 | 0.73 | 0.239 | 0.692 | 2.44 | 0.155 | 0.063 | 0.72 | 0.434 | 0.535 | 2.56 | 0.283 | 0.291 | 6.45 | 95.3 |

Figure 4:
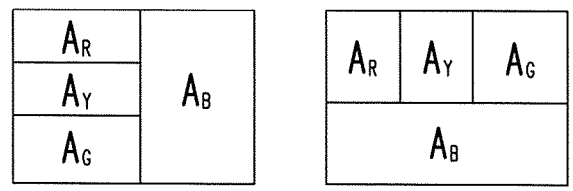
FIG. 4 illustrates a spectrum of the backlight unit according to an experimental example.
Figure 4:
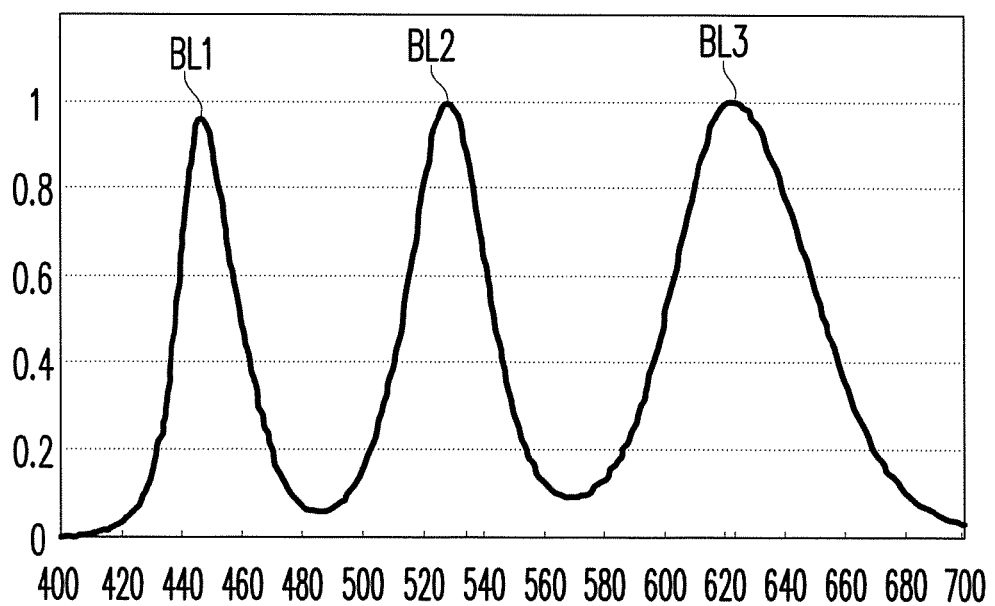

When the spectrum of the backlight unit is as shown in FIG. 4 (i.e., BL1<BL2 and BL1<BL3), the values of $R_x$, $R_y$, RY, $G_x$, $G_y$, GY, $B_x$, $B_y$, BY, $Y_x$, $Y_y$, and YY comply with the values shown in the left columns of Table 2. Besides, when $A_R:A_G:A_B:A_Y=1:1.3:3:1$, the chromatic coordinate of the white dot on the LCD panel is (0.341, 0.352), and the color saturation (NTSC %) of the LCD panel is approximately 86.9%.

TABLE 2

| $R_x$ | $R_y$ | RY | $G_x$ | $G_y$ | GY | $B_x$ | $B_y$ | BY | $Y_x$ | $Y_y$ | YY | Wx | Wy | WY | NTSC % |
|---|---|---|---|---|---|---|---|---|---|---|---|---|---|---|---|
| 0.672 | 0.316 | 0.84 | 0.265 | 0.673 | 2.30 | 0.158 | 0.091 | 0.63 | 0.467 | 0.506 | 2.60 | 0.341 | 0.352 | 6.37 | 86.9 |

As indicated in Table 1 and Table 2, the spectrum of the backlight unit in this application poses certain impact on the chromatic coordinate of the white dot. After the proper spectrum of the backlight unit is determined, the issue of the shifted chromatic coordinate of the white dot can be effectively resolved by controlling the ratio (i.e., $A_R:A_G:A_B:A_Y$) of the areas occupied by the red, green, blue, and yellow filter layers.

Although the application has been disclosed by the above embodiments, they are not intended to limit the application. Those skilled in the art may make some modifications and alterations without departing from the spirit and scope of the application. Therefore, the protection range of the application falls in the appended claims.

What is claimed is:

1. A liquid crystal display comprising:
   a backlight unit comprising an exciting light source and quantum dot remote phosphor, wherein a spectrum of the backlight unit has relative maximum brightness peaks BL1, BL2, and BL3 when wavelengths of light range from between 445 inn to 455 nm, from 528 nm to 538 nm, and from 618 nm to 628 nm, respectively, and the relative maximum brightness peak BL1 is higher than the relative maximum brightness peak BL2; and
   a liquid crystal display panel located above the backlight unit and having a red filter layer, a green filter layer, a blue filter layer, and a yellow filter layer, wherein areas of the red, green, blue, and yellow filter layers are $A_R$, $A_G$, $A_B$, and $A_Y$, respectively, and the areas $A_R$, $A_G$, $A_B$, and $A_Y$ satisfy following conditions:

$0.75 < A_R/A_G < 0.85$;

$0.3 < A_R/A_B < 0.4$; and $0.95 < A_R/A_Y < 1.05$.

2. The liquid crystal display as recited in claim 1, wherein the red, green, blue, and yellow filter layers satisfy following conditions:
   when the backlight unit irradiates the red filter layer, $R_x$ is defined as an x coordinate of a red light filtered by the red filter layer in a CIE 1931 chromaticity coordinate diagram, $R_y$ is defined as an y coordinate of the red light filtered by the red filter layer in the CIE 1931 chromaticity coordinate diagram, $0.665 < R_x < 0.675$, and $0.305 < R_y < 0.315$;
   when the backlight unit irradiates the green filter layer, $G_x$ is defined as an x coordinate of a green light filtered by the green filter layer in the CIE 1931 chromaticity coordinate diagram, $G_y$ is defined as an y coordinate of the green light filtered by the green filter layer in the CIE 1931 chromaticity coordinate diagram, $0.235<G_x<0.245$, and $0.690<G_y<0.700$;

when the backlight unit irradiates the blue filter layer, $B_x$ is defined as an x coordinate of a blue light filtered by the blue filter layer in the CIE 1931 chromaticity coordinate diagram, $B_y$ is defined as an y coordinate of the blue light filtered by the blue filter layer in the CIE 1931 chromaticity coordinate diagram, $0.150<B_x<0.160$, and $0.060<B_y<0.070$; and when the backlight unit irradiates the yellow filter layer, $Y_x$ is defined as an x coordinate of a yellow light filtered by the yellow filter layer in the CIE 1931 chromaticity coordinate diagram, $Y_y$ is defined as an y coordinate of the yellow light filtered by the yellow filter layer in the CIE 1931 chromaticity coordinate diagram, $0.430<Y_x<0.440$, and $0.530<Y_y<0.540$.

3. The liquid crystal display as recited in claim 1, wherein the relative maximum brightness peak BL1 is higher than the relative maximum brightness peak BL3.

4. The liquid crystal display as recited in claim 1, wherein BL1:BL2:BL3=1:0.63:0.657.

5. The liquid crystal display as recited in claim 1, wherein a chromatic coordinate of a white dot on the liquid crystal display panel is ($W_x$, $W_y$), $0.275<W_x<0.285$, and $0.285<W_y<0.295$ when the backlight unit irradiates the liquid crystal display panel.

6. The liquid crystal display as recited in claim 1, wherein $A_R:A_G:A_B:A_Y=1:1.3:3:1$.

7. The liquid crystal display as recited in claim 1, wherein the backlight unit comprises a direct-type backlight unit or an edge-type backlight unit.

8. The liquid crystal display as recited in claim 1, wherein the exciting light source comprises a light emitting diode chip package, and the light emitting diode chip package comprises:
a carrier;
a light emitting diode chip emitting exciting light, the light emitting diode chip being configured on the carrier and electrically connected to the carrier; and
a molding compound encapsulating a portion of the carrier and the light emitting diode chip, wherein the quantum dot remote phosphor is distributed in the molding compound and located on a transmission path of the exciting light.

9. The liquid crystal display as recited in claim 1, wherein the exciting light source comprises a light emitting diode chip package, and the light emitting diode chip package comprises:
a carrier;
a light emitting diode chip emitting exciting light, the light emitting diode chip being configured on the carrier and electrically connected to the carrier, wherein the quantum dot remote phosphor covers the light emitting diode chip and is located on a transmission path of the exciting light; and
a molding compound encapsulating a portion of the carrier and the light emitting diode chip.

* * * * *